United States Patent
Fang et al.

(10) Patent No.: US 9,910,945 B2
(45) Date of Patent: Mar. 6, 2018

(54) METHODS, SYSTEMS, AND COMPUTER-READABLE MEDIA FOR REFERENCE IMPEDANCE ADAPTATION IN ELECTROMAGNETIC SIMULATION AND MODELING

(75) Inventors: Jiayuan Fang, Saratoga, CA (US); Guoxin Fan, Santa Clara, CA (US)

(73) Assignee: Sigrity, Inc., Campbell, CA (US)

( * ) Notice: Subject to any disclaimer, the term of this patent is extended or adjusted under 35 U.S.C. 154(b) by 1076 days.

(21) Appl. No.: 13/306,082

(22) Filed: Nov. 29, 2011

(65) Prior Publication Data

US 2013/0138402 A1    May 30, 2013

(51) Int. Cl.
G06F 17/10 (2006.01)
G06F 17/50 (2006.01)

(52) U.S. Cl.
CPC ................ G06F 17/5036 (2013.01)

(58) Field of Classification Search
CPC ......... H03H 7/40; H02J 5/005; G06F 17/5036
USPC ................................................ 703/2, 13, 14
See application file for complete search history.

(56) References Cited

U.S. PATENT DOCUMENTS

| | | | |
|---|---|---|---|
| 5,585,766 A * | 12/1996 | Shel | 333/17.3 |
| 8,938,372 B1 * | 1/2015 | Petersson et al. | 703/2 |
| 2008/0195344 A1 * | 8/2008 | Heuermann et al. | 702/107 |
| 2012/0029887 A1 * | 2/2012 | Tseng et al. | 703/2 |

OTHER PUBLICATIONS

Defination for the terms "admittance", from the oxford online dictionary, retreived Aug. 25, 2014, http://www.oxforddictionaries.com/us/definition/american_english/admittance.*
Mario Mario Križan, S-parameter approximation usingrational funtion, University of Zagreb, Nov. 6, 2011, https://web.archive.org/web/20140825172417/https://bib.irb.hr/datoteka/552148.S-parameter_Approximation_Using_Rational_Function.pdf.*
Julian Ferry, Characterizing Non-Standard Impedance Channels with 50 Ohm Instruments, DesignCon 2009, http://www.keysight.com/upload/cmc_upload/All/MicrosoftWord-Non_Standard_Impedance.pdf?&cc=US&lc=eng.*
David M. Pozar, "Microwave Engineering," 1990, Addison-Wesley, pp. 205-237.*
John Edward Daniel, "Development of enhanced multiport network analyzer calibrations using non-ideal standards," 2005, University of South Florida, 279 pages.*
Stephen H. Hall et al.,"Advanced Signal Integrity for High-Speed Designs," 2009, John Wiley & Sons, pp. 347-415.*

(Continued)

Primary Examiner — Kamini S Shah
Assistant Examiner — Russ Guill
(74) Attorney, Agent, or Firm — Andrews Kurth Kenyon LLP (57) ABSTRACT

Methods, systems, and computer-readable media for reference impedance adaptation are disclosed. The method may comprise a step of providing a network model of a circuit having at least one port, wherein the network model includes at least one network parameter, the network parameter being associated with the port and being defined based on a reference impedance of the port. The method may further comprise computing an input impedance of the port based on the network parameter. The method may also include defining a new reference impedance for the port based on the input impedance. Moreover, the method may include calculating a new network parameter of the network model based on the new reference impedance.

21 Claims, 10 Drawing Sheets

(56) References Cited

OTHER PUBLICATIONS

Stefan Jahn, "N-port matrix conversions," 2007, http://qucs.sourceforge.net/tech/node98.html, 11 pages.*

Brad Brim, "Re: S11 and S21 for PCB trace with different dielectic think," 2009, http://www.freelists.org/post/si-list/S11-and-S21-for-PCB-trace-with-different-dielectic-think, five pages.*

Roger B. Marks et al., "A General Waveguide Circuit Theory," 1992, Journal of Research of the National Institute of Standars and Technology, vol. 97, No. 5, pp. 533-562.*

Richard L. Burden et al., "Numerical Analysis," fourth edition, 1989, PWS-KENT Publishing Company, pp. 400-414.*

Goran Andersson, "Modelling and Analysis of Electric Power Systems," 2008, Swiss Federal Institute of Technology Zurich, 183 pages.*

M.N. Vrahatis et al., "From linear to nonlinear iterative methods," 2003, Applied Numerical Mathematics, vol. 45, pp. 59-77.*

Jim Lambers, "Fixed points for functions of several variables," 2009, http://www.math.usm.edu/lambers/mat461/spr10/lecture22.pdf, pp. 1-4.*

Roland Neumayer et al., "Synthesis of SPICE-compatible broadband electrical models from n-port scattering parameter data," 2002, IEEE International Symposium on Electromagnetic Compatibility 2002, pp. 469-474.*

* cited by examiner

METHODS, SYSTEMS, AND COMPUTER-READABLE MEDIA FOR REFERENCE IMPEDANCE ADAPTATION IN ELECTROMAGNETIC SIMULATION AND MODELING

TECHNICAL FIELD

The present invention relates to methods, systems, and computer-readable media for simulating and modeling electrical components, interconnects, and microwave/RF circuits. More particularly, the present invention relates to methods, systems, and computer-readable media for adaptively changing reference impedance of network in calculating network parameters, such as S-parameters.

BACKGROUND

In electromagnetic simulation and analysis, network models are often utilized for analyzing electrical components, circuits, and systems. Network models may be characterized by network parameters, such as impedance parameters and scattering parameters (S-parameters).

S-parameters are often represented in matrix form and associated with reference impedance. The reference impedance is often set to be 50 Ohms ($\Omega$), partly because the characteristic impedance of typical signal transmission line systems is around 50$\Omega$. However, for systems with power/ground lines, the effective input impedance is typically much smaller than 50$\Omega$. Therefore, S-parameters generated using 50$\Omega$ reference impedance may be insensitive to the variation of electrical properties of power/ground systems.

Accordingly, there is a need for a system and method for adapting reference impedance in order to improve accuracy in electromagnetic simulation and modeling.

SUMMARY

Some aspects of the disclosed embodiments may involve methods, systems, and computer-readable media for analyzing electrical properties of a circuit. The method may comprise a step of providing a network model of the circuit having at least one port, wherein the network model includes at least one network parameter, the network parameter being associated with the port and being defined based on a reference impedance of the port. The method may further comprise computing an input impedance of the port based on the network parameter. The method may also include defining a new reference impedance for the port based on the input impedance. Moreover, the method may include calculating a new network parameter of the network model based on the new reference impedance.

The preceding summary is not intended to restrict in any way the scope of the claimed invention. In addition, it is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments and exemplary aspects of the present invention and, together with the description, explain principles of the invention. In the drawings.

DESCRIPTION OF EXEMPLARY EMBODIMENTS

Reference will now be made in detail to exemplary embodiments of the invention, examples of which are illustrated in the accompanying drawings. When appropriate, the same reference numbers are used throughout the drawings to refer to the same or like parts.

Embodiments of the present disclosure may involve system, method, and computer-readable medium for simulating and/or analyzing an electrical circuit. The term "electrical circuit" (or "circuit") may refer to any path which electrons from a voltage or current source follow. Electrical circuits may be physically implemented on circuit structures such as integrated circuit (IC) chips, modules, chip or module carriers, cards, boards, and/or back-planes. Such circuit structures may include multiple layers to sandwich electronic components and/or signal/power/ground lines. During design, fabrication, and/or testing of electrical circuits, computer simulation may be performed to analyze, evaluate, and/or verify electrical properties and/or behaviors of the circuits.

Figure 1:
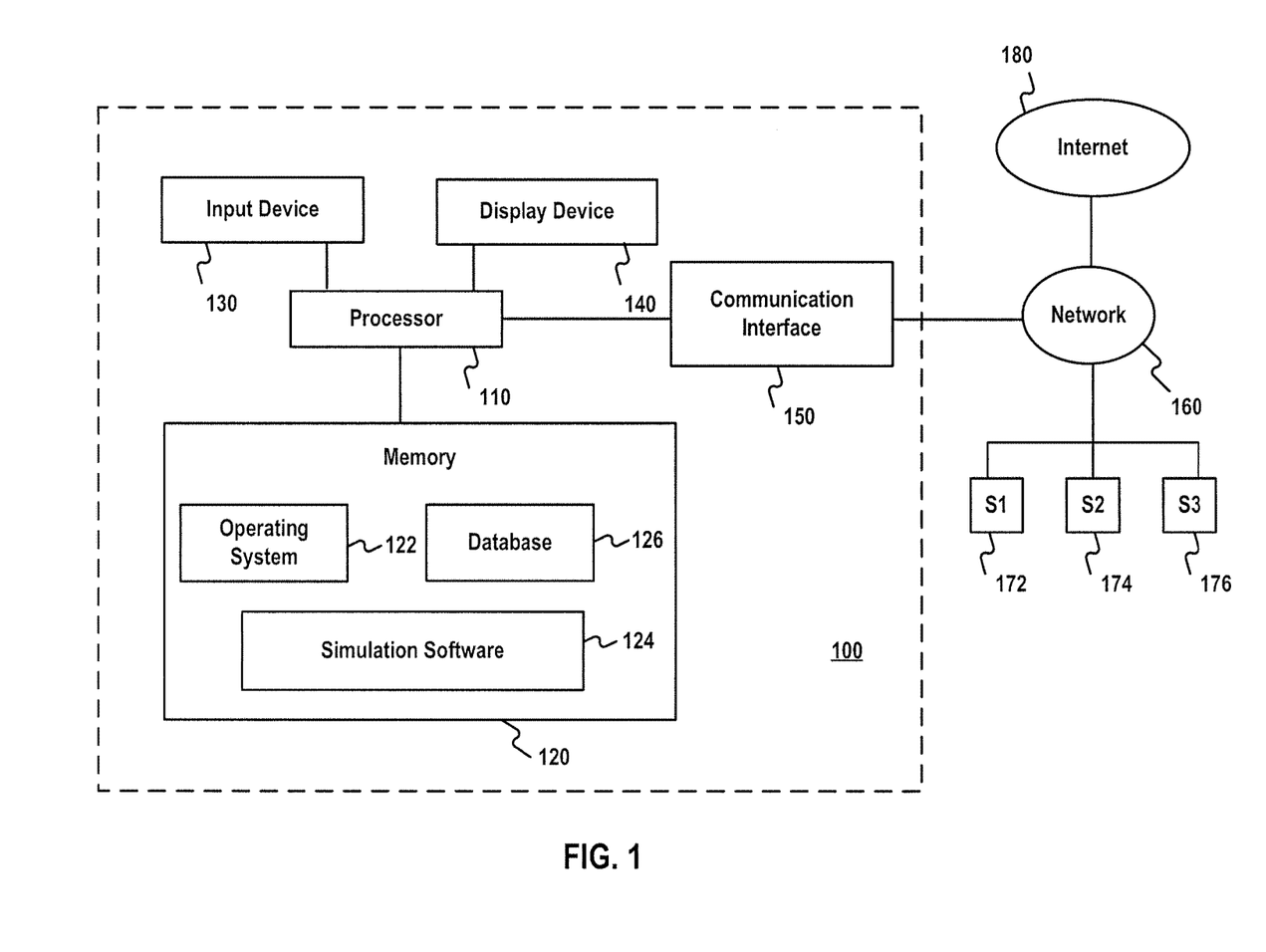
FIG. 1 shows an exemplary system for simulating and/or analyzing an electrical circuit, consistent with some disclosed embodiments.

FIG. 1 shows an exemplary system 100 for simulating an electrical circuit. Consistent with some embodiments, system 100 may be a general purpose computer, or a computing device dedicated for simulation. As shown in FIG. 1, system 100 may include a processor 110, a memory module 120, a user input device 130, a display device 140, and a communication interface 150. Processor 110 can be a central processing unit ("CPU") or a graphic processing unit ("GPU"). Depending on the type of hardware being used, processor 110 can include one or more printed circuit boards, and/or a microprocessor chip. Processor 110 can execute sequences of computer program instructions to perform various methods that will be explained in greater detail below.

Memory module 120 can include, among other things, a random access memory ("RAM") and a read-only memory ("ROM"). The computer program instructions can be accessed and read from the ROM, or any other suitable memory location, and loaded into the RAM for execution by processor 110. For example, memory module 120 may store one or more software applications. Software applications stored in memory module 120 may comprise operating system 122 for common computer systems as well as for software-controlled devices. Further, memory module may store an entire software application or only a part of a software application that is executable by processor 110.

In some embodiments, memory module 120 may store simulation software 124 that may be executed by processor 110. For example, simulation software 124 may be executed to simulate electrical behaviors/properties of electrical circuits. It is also contemplated that simulation software 124 or portions of it may be stored on a removable computer readable medium, such as a hard drive, computer disk, CD-ROM, DVD±R, CD±RW or DVD±RW, HD or Blu-ray DVD, USB flash drive, SD card, memory stick, or any other suitable medium, and may run on any suitable component of system 100. For example, portions of applications to perform simulation may reside on a removable computer readable medium and be read and acted upon by processor 110 using routines that have been copied to memory 120.

In some embodiments, memory module 120 may also store master data, user data, application data and/or program code. For example, memory module 120 may store a database 126 having therein various simulation data used for simulating electrical circuits.

In some embodiments, input device 130 and display device 140 may be coupled to processor 110 through appropriate interfacing circuitry. In some embodiments, input device 130 may be a hardware keyboard, a keypad, or a touch screen, through which a user may input information to system 100. Display device 140 may include one or more display screens that display the simulation interface, result, or any related information to the user.

Communication interface 150 may provide communication connections such that system 100 may exchange data with external devices. For example, system 100 may be connected to network 160. Network 160 may be a LAN or WAN that may include other systems S1 (172), S2 (174), and S3 (176). Systems S1, S2, and/or S3 may be identical to system 100, or may be different systems. In some embodiments, one or more of systems in network 160 may form a distributed computing/simulation environment that collaboratively performs simulation task. In addition, network 160 may be connected to Internet 180 to communicate with servers or clients that reside remotely on the Internet.

Figure 2A:
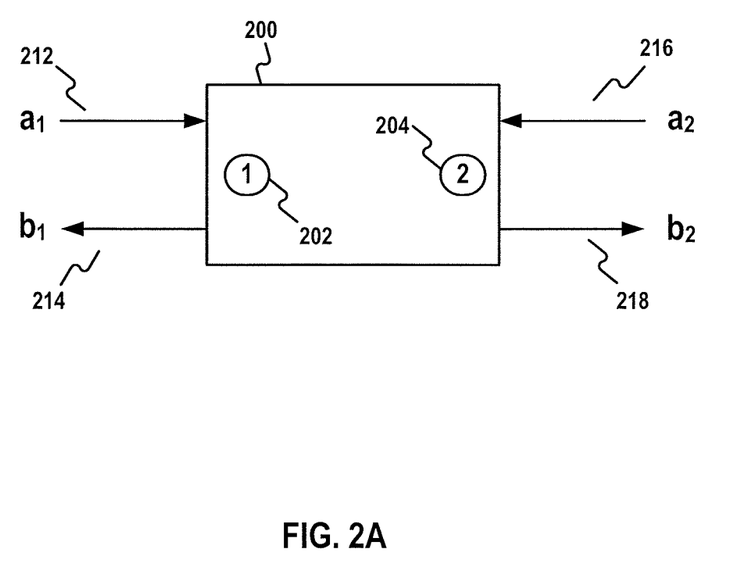
FIGS. 2A and 2B are schematic diagrams of a network model, in accordance with some disclosed embodiments.

FIG. 2A illustrates an exemplary network model. The term "network," also known as "electrical network," refers to an interconnection of electrical elements such as resistors, inductors, capacitors, transmission lines, voltage sources, current sources, switches, etc. A network may include one or more ports. A port may be a point at which electrical currents either enter or exit a network. The term "network model" refers to a mathematical representation of a physical network. A network model may include graphical representations of the network and associated ports. A network model may also include a set of mathematical expressions and/or values that characterize the properties and/or behaviors of the network. As used herein, a network model may also be referred to as a network for simplicity.

Referring to FIG. 2, network 200 may include two ports: port 1 (202) and port 2 (204). In general, a network may include any number of ports. For each port, incident waves and reflected waves may be defined. For example, for port 1 (202), $a_1$ (212) represents incident waves and $b_1$ (214) represents reflected waves. Similarly, for port 2 (204), $a_2$ (216) represents incident waves and $b_2$ (218) represents reflected waves. The incident and reflected waves may be represented as voltage travelling waves incident and reflected from a port normalized to a reference impedance $Z_0$ such that when squared the waves are equal to the power traveling along the line connecting to the port. For example, for the network 200 in FIG. 2, the incident and reflected waves on ports 1 and 2 may be represented as:

$$a_1 = \frac{V_{i1}}{\sqrt{Z_{01}}}; \tag{1}$$

$$b_1 = \frac{V_{r1}}{\sqrt{Z_{01}}}; \tag{2}$$

$$a_2 = \frac{V_{i2}}{\sqrt{Z_{02}}}; \text{ and} \tag{3}$$

$$b_2 = \frac{V_{r2}}{\sqrt{Z_{02}}}. \tag{4}$$

In equations (1)-(4), $V_{i1}$ and $V_{i2}$ are voltage traveling waves incident on ports 1 and 2, respectively. $V_{r1}$ and $V_{r2}$ are voltage traveling waves reflected from ports 1 and 2, respectively. $Z_{01}$ and $Z_{02}$ are reference impedances of ports 1 and 2, respectively. A set of network parameters may be expressed as:

$$\begin{pmatrix} b_1 \\ b_2 \end{pmatrix} = \begin{pmatrix} S_{11} & S_{12} \\ S_{21} & S_{22} \end{pmatrix} \begin{pmatrix} a_1 \\ a_2 \end{pmatrix}. \tag{5}$$

The network parameters defined by equation (5) are normally called scattering parameters, or S-parameters. When expanded, equation (5) becomes:

$$b_1 = S_{11}a_1 + S_{12}a_2; \text{ and} \tag{6}$$

$$b_2 = S_{21}a_1 + S_{22}a_2 \tag{7}$$

The network parameters are therefore:

$$S_{11} = \frac{b_1}{a_1}\bigg|(a_2 = 0); \tag{8}$$

$$S_{21} = \frac{b_2}{a_1}\bigg|(a_2 = 0); \tag{9}$$

$$S_{12} = \frac{b_1}{a_2}\bigg|(a_1 = 0); \text{ and} \tag{10}$$

$$S_{22} = \frac{b_2}{a_2}\bigg|(a_1 = 0). \tag{11}$$

If defining port 1 as an input port and port 2 as an output port, $S_{11}$ may also be referred to as input reflection coefficient when port 2 is matched terminated; $S_{21}$ may also be referred to as forward transmission coefficient when port 2 is matched terminated; $S_{12}$ may also be referred to as reverse transmission coefficient when port 1 is matched terminated; and $S_{22}$ may also be referred to as output reflection coefficient when port 1 is matched terminated. As used herein, a port is matched terminated when the port is connected to a load having an impedance equal to the characteristic impedance of the port, so that no wave is reflected from the load into the port. In general, either port 1 or port 2 may be an input port.

When port 2 is connected to a load having an impedance equal to $Z_{02}$ (also known as terminated in $Z_{02}$), no wave is reflected back into port 2, therefore $a_2=0$. $S_{21}$ and $S_{11}$ can be related by the following equation:

$$S_{21} = \frac{\sqrt{Z_{01}}}{\sqrt{Z_{02}}} \times \frac{V_{out}}{V_{in}}(1 + S_{11}), \quad (12)$$

where $$V_{in} = \sqrt{Z_{01}}\,(a_1 + b_1), \text{ and} \quad (13)$$

$$V_{out} = \sqrt{Z_{02}}\,b_2. \quad (14)$$

As used herein, a characteristic impedance refers to the physical impedance of a transmission line or waveguide. A reference impedance refers to a port impedance to which network parameters can be referenced. The reference impedance can be arbitrary and form the basis for the network parameter calculations. For example, the definition of $S_{ij}$ implies that all ports except for port j are terminated in their reference impedance and the source impedance of port j is equal to its reference impedance.

Figure 2B:
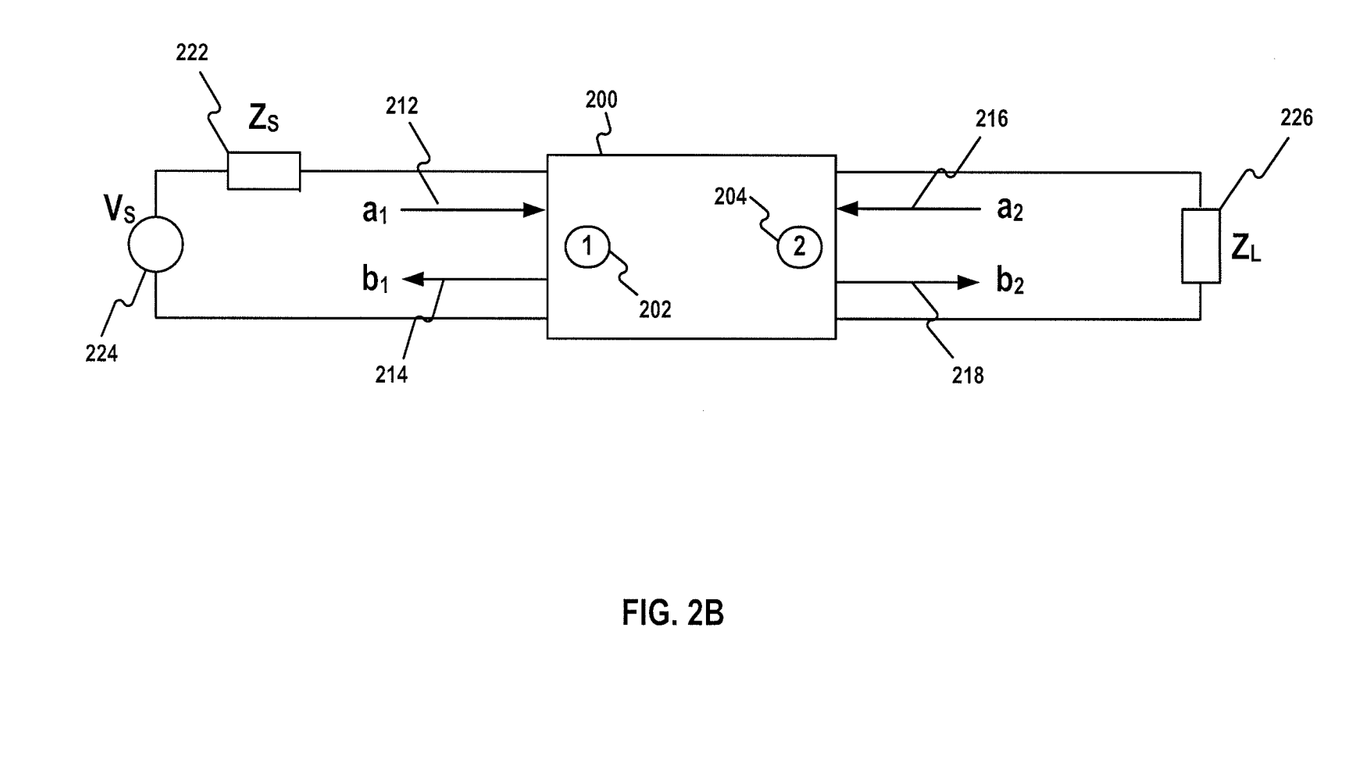

Referring to FIG. 2B, network 200 is now connected to a voltage source 224 at port 1 and a load 226 at port 2. Voltage source 224 has a voltage of $V_S$ and a source impedance of $Z_S$, which is represented by impedance 222. Load 226 has a load impedance $Z_L$. Further, the reference impedance of ports 1 and 2 are $Z_{01}$ and $Z_{02}$, respectively. Input impedance $Z_1$ at port 1 can be defined as the impedance across the terminals of port 1 when port 2 is terminated by load 226 while source 224 along with source impedance 222 are disconnected. Similarly, output impedance Z2 at port 2 can be defined as the impedance across the terminals of port 2 with load 226 disconnected and source 224 replaced by a short circuit. In this case, source impedance 222 terminates port 1. For the network model in FIG. 2B, the following coefficients can be derived.

Load reflection coefficient $\Gamma_L$ can be represented by:

$$\Gamma_L = \frac{Z_L - Z_{02}}{Z_L + Z_{02}}. \quad (15)$$

Source reflection coefficient $\Gamma_S$ can be represented by:

$$\Gamma_S = \frac{Z_S - Z_{01}}{Z_S + Z_{01}}. \quad (16)$$

Input reflection coefficient $\Gamma_1$ and output reflection coefficient $\Gamma_2$ can be represented by:

$$\Gamma_1 = \frac{Z_1 - Z_{01}}{Z_1 + Z_{01}} = \frac{b_1}{a_1}, \text{ and} \quad (17)$$

$$\Gamma_2 = \frac{Z_2 - Z_{02}}{Z_2 + Z_{02}} = \frac{b_2}{a_2}. \quad (18)$$

Therefore, from equations (6), (7), and (15)-(18), input reflection coefficient $\Gamma_1$ and output reflection coefficient $\Gamma_2$ can be represented in terms of S-parameters as:

$$\Gamma_1 = S_{11} + \frac{S_{12}S_{21}\Gamma_L}{1 - S_{22}\Gamma_L}, \text{ and} \quad (19)$$

$$\Gamma_2 = S_{22} + \frac{S_{21}S_{12}\Gamma_S}{1 - S_{11}\Gamma_S}. \quad (20)$$

Therefore, if a matched load is used to terminate port 2 then $\Gamma_L=0$, and equation (19) becomes $\Gamma_1=S_{11}$. Similarly, if $Z_S=Z_{01}$ then port 1 is matched and $\Gamma_S=0$, equation (20) becomes $\Gamma_2=S_{22}$.

As discussed above, the reference impedance in many RF and microwave applications is chosen to be 50Ω. This is partly because the characteristic impedance of typical transmission line systems is around 50Ω. However, for systems involving power and ground lines, the effective port input impedance is much smaller than 50Ω. For example, the effective port input impedance in some power and ground systems may be in the order of milliohms. In such cases, the network parameters, such as S-parameters, having a reference impedance of 50Ω, may not be sensitive to the variation of electrical properties of the power and ground systems. For example, if the input impedance is about 5 mΩ, and the reference impedance is 50Ω, then the amplitude of $S_{11}$ would be about 0.9998. When the input impedance changes to 10 mΩ, a 100% variation, the amplitude of $S_{11}$ would be about 0.9996, only a 0.02% variation.

Figure 3A:
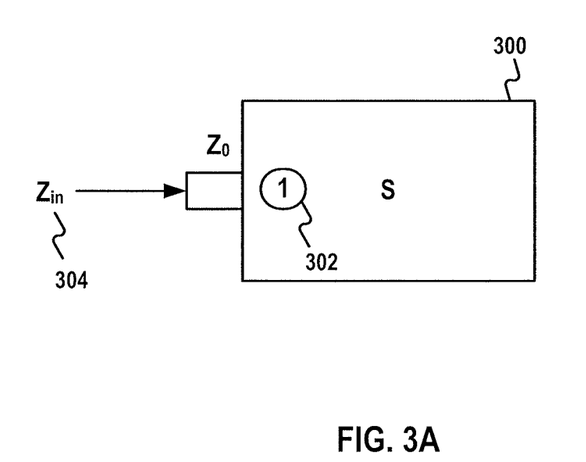
FIGS. 3A and 3B illustrate an exemplary method for impedance adaptation for a one-port network, in accordance with some disclosed embodiments.
Figure 3B:
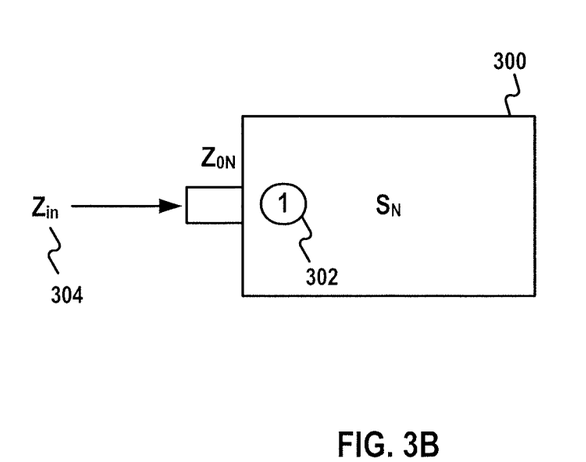

FIGS. 3A and 3B illustrate an exemplary method for impedance adaptation for a one-port network, in accordance with some disclosed embodiments. In FIG. 3A, a network model 300 is provided, with a network parameter S (S can be of matrix form that includes a plurality of values). In some embodiments, S can be a scattering parameter (or S-parameter). For networks with more than one ports (e.g., M ports), S-parameters can be of a matrix form:

$$\begin{bmatrix} S_{11} & S_{12} & \cdots & S_{1M} \\ S_{21} & S_{22} & \cdots & S_{2M} \\ \vdots & \vdots & \ddots & \vdots \\ S_{M1} & S_{M2} & \cdots & S_{MM} \end{bmatrix}.$$

Network model 300 may be a model of an electrical circuit. Network model 300 may include a port 302, which is referred to as port 1. Network parameter S is associated with port 1 and is defined based on reference impedance $Z_0$ of port 1. Network parameter S may include, for example, a parameter associated with the reflection coefficient $\Gamma$ of port 1, such as $S_{11}$. Reflection coefficient $\Gamma$ is related to reference impedance $Z_0$ and input impedance $Z_{in}$ (304) of port 1 as follows:

$$\Gamma = \frac{Z_{in} - Z_0}{Z_{in} + Z_0} \quad (21)$$

Therefore, input impedance $Z_{in}$ can be computed by:

$$Z_{in} = Z_0 \frac{1 + \Gamma}{1 - \Gamma} \quad (22)$$

It is noted that input impedance $Z_{in}$ can be a function of frequency. For example, for different frequencies $f_i$ and $f_j$ in a frequency range of interest from $f_1$ to $f_2$ ($f_1 \le f_i \le f_2$, $f_1 \le f_j \le f_2$, $f_i \ne f_j$), $Z_{in}(f_i)$ can be different from $Z_{in}(f_j)$. In this case, average or weighted input impedance may be used. The average input impedance may be calculated by averaging two or more impedance values within the frequency range of interest. Additionally, weights can be added to one or more impedance values to obtain a weighted average. Other methods may also be used to take into account input impedance values of the entire or a portion of the frequency range of interest. In any case, average input impedance can be obtained. For example, if input impedance in a frequency range of interest ranging from 1 to 15 mΩ the average input impedance of 10 mΩ may be obtained, after the process of averaging or weighted averaging, as discussed above. For simplicity, in the following description, $Z_{in}$ will represent average input impedance (or simply "input impedance") instead of frequency-dependent input impedance, unless otherwise noted.

Referring now to FIG. 3B, new reference impedance $Z_{0N}$ can be defined for port 1 based on the computed input impedance $Z_{in}$. In some embodiments, $Z_{0N}$ can simply be equal to $Z_{in}$. In other embodiments, $Z_{0N}$ can be defined to be a value that is in the same or similar order of $Z_{in}$. For example, in typical RF and microwave applications, $Z_0$ may be 50Ω. If power and/or ground line is present in the circuit, $Z_{in}$ may range from 1 to 100 ma By way of example, if $Z_{in}$ is 15 mΩ, $Z_{0N}$ can be defined to be 15 mΩ or other suitable values in the same or similar order of $Z_{in}$. In this way, the reference impedance can be adaptively changed to suit for input impedance of a particular port.

After $Z_{0N}$ is defined, a new network parameter $S_N$ can be calculated based on $Z_{0N}$. For example, $S_N$ can be obtained as follows:

$$Z = (I-S)^{-1}(I+S)Z_0 \quad (23)$$

$$S_N = (Z-Z_{0N}I)(Z+Z_{0N}I)^{-1} \quad (24)$$

where Z is an impedance matrix and I is a unit matrix. Equations (23) and (24) are applicable to both one-port and multi-port networks.

Figure 4A:
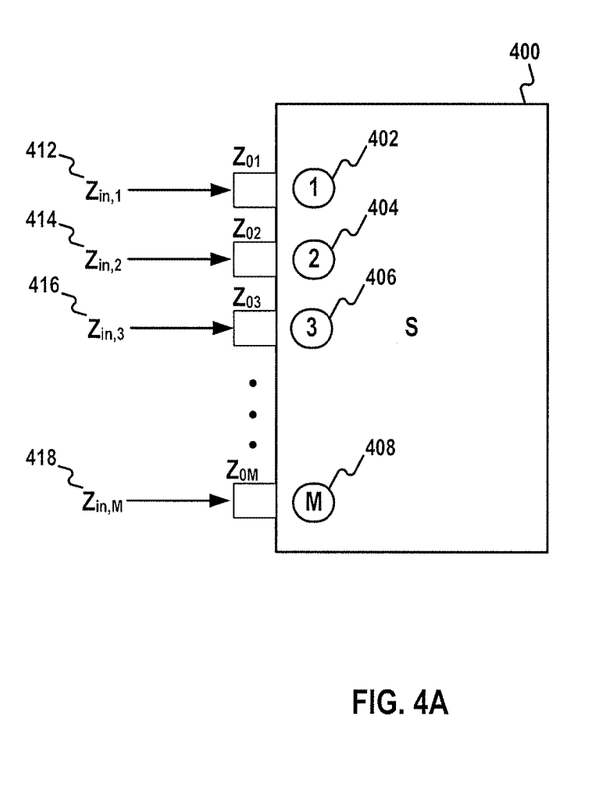
FIGS. 4A and 4B illustrate an exemplary method for impedance adaptation for a multi-port network, in accordance with some disclosed embodiments.
Figure 4B:
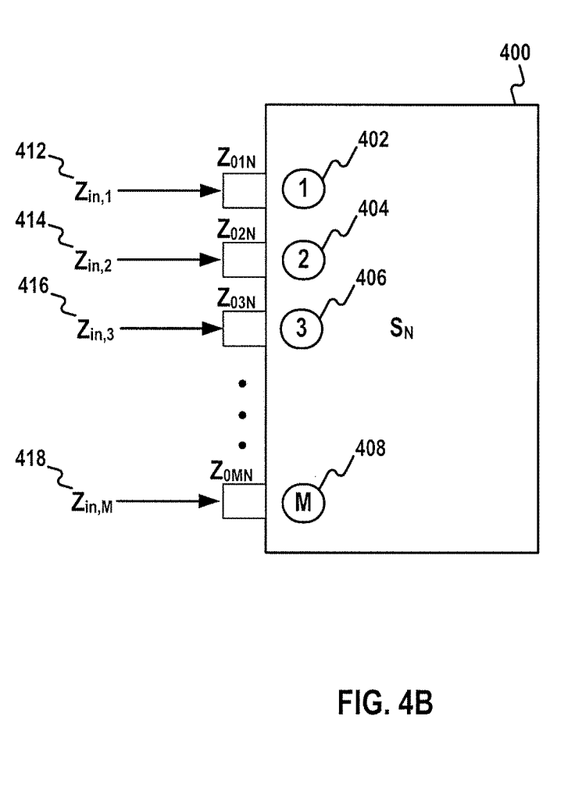

FIGS. 4A and 4B illustrate an exemplary method for impedance adaptation for a multi-port network, in accordance with some disclosed embodiments. In FIG. 4A, a network model 400 is provided. Network model 400 includes a plurality of ports: ports 1 (402), 2 (404), 3 (406), ... M (408). Network parameter S (may be in matrix form that includes a plurality of values) is defined based on ports 1 to M. Each value in S may be associated with at least one port and is defined based on the reference impedance of the port. For example, $Z_{01}, Z_{02}, Z_{03}, \ldots, Z_{0M}$ are the reference impedance of ports 1, 2, 3, ... M, respectively. During impedance adaptation, input impedance of each port can be computed.

In one embodiment, input impedance of each port of network model 400 can be computed iteratively. For example, input impedance $Z_{in,1}$ (412) of port 1 (402) can be computed based on S (e.g., $S_{11}$) and $Z_{01}$, according to, for example, equation (22), with all the other ports terminated by their respective reference impedance $Z_{02}, Z_{03}$, etc. Similarly, input impedance $Z_{in,2}$ (414) of port 2 (404) can be computed based on S (e.g., $S_{22}$) and $Z_{02}$, with all the other ports terminated by their respective reference impedance $Z_{01}, Z_{03}$, etc. Similar computation can be performed to obtain other input impedance: $Z_{in,3}$ (416) of port 3 (406) to $Z_{in,M}$ (418) of port M (408).

Referring now to FIG. 4B, a new reference impedance may be defined for each port of network model 400. For example, new reference impedance $Z_{01N}$ can be defined for port 1 (402) based on $Z_{in,1}$ (412). Similarly, new reference impedance $Z_{02N}$ can be defined for port 2 (406) based on $Z_{in,2}$ (414); new reference impedance $Z_{03N}$ can be defined for port 3 (406) based on $Z_{in,3}$ (416); ... new reference impedance $Z_{0MN}$ can be defined for port M (408) based on $Z_{in,M}$ (418). After all new reference impedance values have been obtained, an iteration cycle can be deemed complete.

Additional iteration cycles can be performed to further improve the accuracy of the input impedance. For example, after a set of new reference impedance values have been obtained, the new reference impedance (e.g., $Z_{01N}, Z_{02N}, Z_{03N}, \ldots Z_{0MN}$) can replace the respective original reference impedance (e.g., $Z_{01}, Z_{02}, Z_{03}, \ldots Z_{0M}$). Thereafter, an updated input impedance (e.g., $Z_{in,1}$) can be computed based on S (e.g., $S_{11}$) and its corresponding new reference impedance (e.g., $Z_{01N}$), with all other ports terminated by their respective new reference impedance. Accordingly, a set of updated input impedance can be obtained and the set of new reference impedance can be subsequently updated based on the updated input impedance. Such iteration cycles may be performed multiple times until a predetermined number of cycles are reached or a predetermined tolerance is reached (e.g., below a predetermined threshold). The tolerance/threshold may be defined based on, for example, the difference between corresponding input impedance values between consecutive iteration cycles.

In another embodiment, the new reference impedance can be used to replace old reference impedance on the fly. For example, in the first iteration cycle, after $Z_{in,1}$ of port 1 is obtained, new reference impedance $Z_{01N}$ can be immediately defined based on and replace original reference impedance $Z_{01}$. As a result, during the computation of $Z_{in,2}$, port 1 can be terminated by $Z_{01N}$, instead of $Z_{01}$, and all other ports are terminated by their respective original reference impedance. Similarly, after $Z_{in,2}$ is obtained, $Z_{02N}$ can be immediately defined based on $Z_{in,2}$ and replace original reference impedance $Z_{02}$. Thereafter, $Z_{in,3}$ can be computed with port 1 terminated by $Z_{01N}$, port 2 terminated by $Z_{02N}$, and all other ports terminated by their respective original reference impedance. In this way, the new reference impedance replaces old reference impedance as soon as it has been defined based on available input impedance. This technique may increase the convergence speed during iteration.

In yet another embodiment, input impedance may be computed without iteration. Referring to FIG. 4A, network parameter S (e.g., S-parameters) may be equivalently represented by other types of network parameter, such as impedance parameters (Z-parameters):

$$\begin{bmatrix} Z_{11} & Z_{12} & \ldots & Z_{1M} \\ Z_{21} & Z_{22} & \ldots & Z_{2M} \\ \vdots & \vdots & \ddots & \vdots \\ Z_{M1} & Z_{M2} & \ldots & Z_{MM} \end{bmatrix}$$

or admittance parameters (Y-parameters):

$$\begin{bmatrix} Y_{11} & Y_{12} & \ldots & Y_{1M} \\ Y_{21} & Y_{22} & \ldots & Y_{2M} \\ \vdots & \vdots & \ddots & \vdots \\ Y_{M1} & Y_{M2} & \ldots & Y_{MM} \end{bmatrix}.$$

Specifically, the diagonal elements $Z_{ii}$ (i=1 ... M) of the Z-parameter matrix can be obtained by measuring/calculating input impedance of port i while all other ports are open circuits. Similarly, the diagonal elements $Y_{ii}$ (i=1 ... M) of the Y-parameter matrix can be obtained by measuring/calculating input admittance of port i while all other ports are short circuits. Thereafter, the input impedance $Z_{in,i}$ (i=1 ... M) can be obtained by:

$$Z_{in,i} = \sqrt{\frac{Z_{ii}}{Y_{ii}}}. \quad (25)$$

As discussed above, $Z_{in,i}$ can be a function of frequency and it is used herein as an average value over a frequency range of interest. After $Z_{in,i}$ is obtained, new reference impedance $Z_{0iN}$ can be defined based on $Z_{in,i}$ in a similar manner to the one discussed above.

After new reference impedance values are defined, a new set of network parameters $S_N$ (e.g., in matrix form) may be calculated based on the new reference impedance $Z_{01N}$, $Z_{02N}$, $Z_{03N}$, ... $Z_{0MN}$ (e.g., using equations (23) and (24)).

Figure 5A:
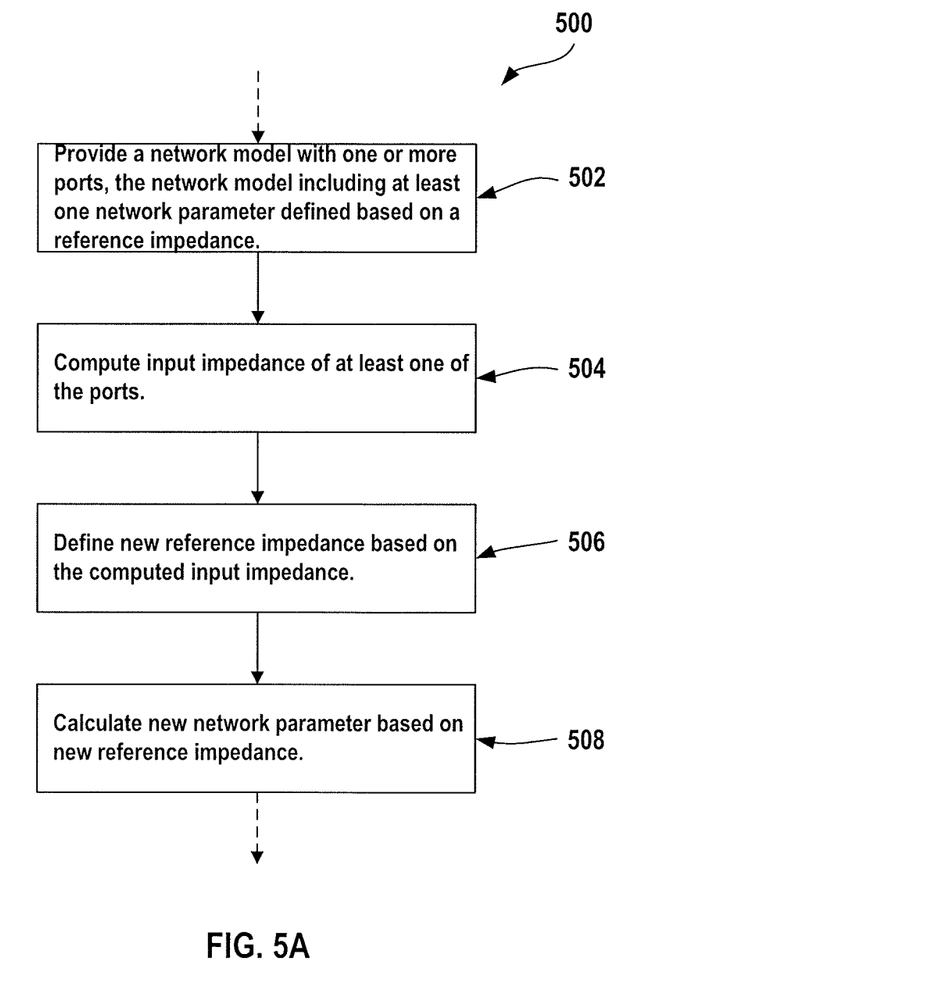
FIG. 5A-5C are flow charts of exemplary methods for impedance adaptation, in accordance with some disclosed embodiments.

FIG. 5A shows a flow chart of an exemplary method for impedance adaptation. In FIG. 5A, method 500 may include a series of steps, in accordance with some embodiments. In step 502, there may be provided a network model with one or more ports (e.g., network 300 with port 302 and network model 400 with ports 402, 404, 406, and 408). The network model may include at least one network parameter (e.g., network parameter S in FIGS. 3A and 3B) defined based on a reference impedance (e.g., reference impedance $Z_0$ in FIG. 3A). In step 504, the input impedance (e.g., input impedance $Z_{in}$ in FIG. 3A) of at least one of the ports may be computed. In step 506, a new reference impedance (e.g., reference impedance $Z_{0N}$ in FIG. 3B) may be defined based on the computed input impedance. In step 508, a new network parameter (e.g., network parameter $S_N$) may be calculated based on the new reference impedance. The dashed arrows above step 502 and below step 508 indicate that the method 500 may be part of another method that includes more steps.

Figure 5B:
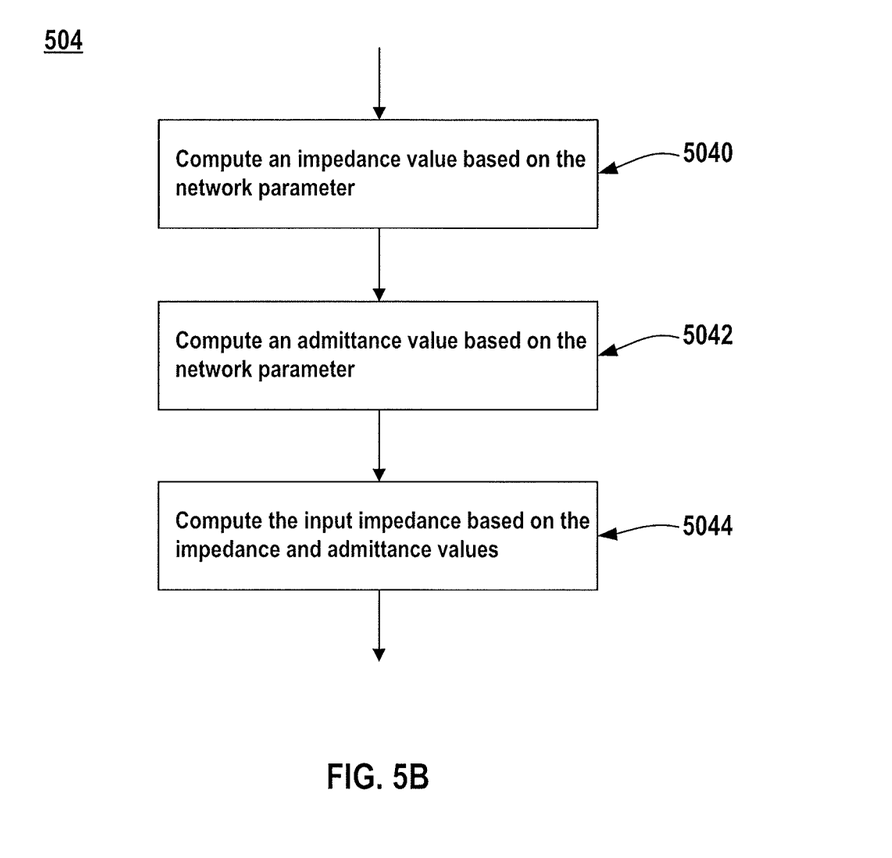

FIG. 5B shows an exemplary method of implementing step 504 in FIG. 5A. As shown in FIG. 5B, step 504 may include a sub step 5040, in which an impedance value (e.g., $Z_{ii}$) may be computed based on the network parameter. In sub step 5042, an admittance value (e.g., $Y_{ii}$) may be computed based on the network parameter. In sub step 5044, the input impedance can be computed based on the impedance and admittance values (e.g., equation 25).

Figure 5C:
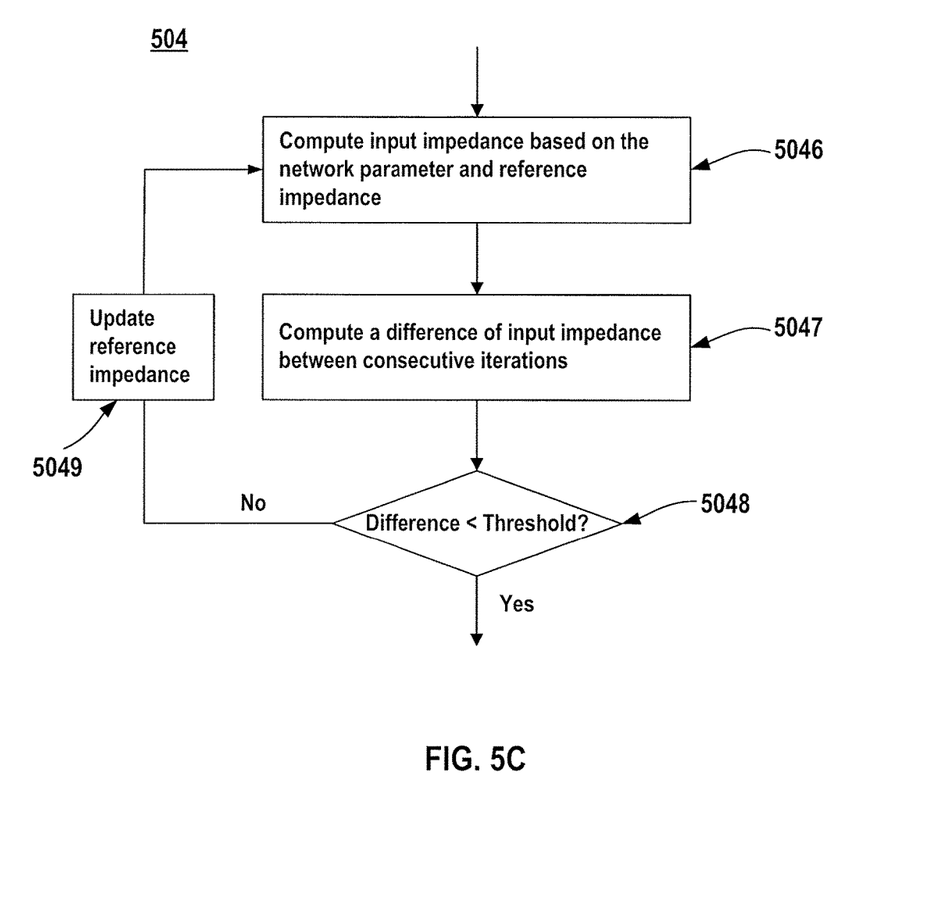

FIG. 5C shows another exemplary method of implementing step 504 in FIG. 5A. As shown in FIG. 5C, step 504 may be implemented in an iterative manner. In sub step 5046, the input impedance may be computed based on the network parameter and reference impedance of the corresponding port. In sub step 5047, a difference of input impedance obtained from consecutive iterations can be computed. For example, the difference can be an absolute value of input impedance difference of a particular port between consecutive iteration cycles, or an average of input impedance differences of a plurality of ports between consecutive iteration cycles, or any other suitable measures. In sub step 5048, the difference is compared with a predetermined threshold. If the difference is below the threshold (branch YES), the method proceeds to step 506 in FIG. 5A. If the difference is not below the threshold (branch NO), the method proceeds to sub step 5049, where the reference impedance is updated based on corresponding input impedance computed in sub step 5046, and returns to sub step 5046 to compute new input impedance based on the network parameter and the updated reference impedance.

In electromagnetic simulation, network parameters, such as S-parameters, can be directly input and utilized by simulation software, such as SPICE-like circuit simulators. Direct S-parameter simulation may generally require relatively longer simulation time, and may suffer from divergence issue in time domain due to its passivity violation. Alternatively, S-parameters can be converted into equivalent circuit model first using macro-modeling method, such as rational function fitting method, and then be inserted into simulation software. With macro-modeling techniques, the network model characterized by S-parameters may be approximated by rational functions through vector-fitting. Passivity enforcement may be applied if necessary. The network model may then be converted into equivalent circuit model for simulation and analysis. Such equivalent circuit model may achieve faster simulation speed than simulating directly with S-parameters.

The above-disclosed impedance adaptation method and system may be applied during equivalent circuit modeling process. As discussed above, in applications involving power and/or ground systems, the commonly used 50Ω reference impedance may not achieve high accuracy in rational function fitting because the S-parameters are insensitive to electrical property variations of power/ground systems. Therefore, the resulting equivalent circuits may suffer poor accuracy. With the disclosed method and system, the reference impedance of each port is automatically adapted based on input impedance. Therefore, the resulting network parameters may be much more sensitive to the electrical property variation of power/ground systems, thereby improving accuracy of the equivalent circuit model.

Figure 6:
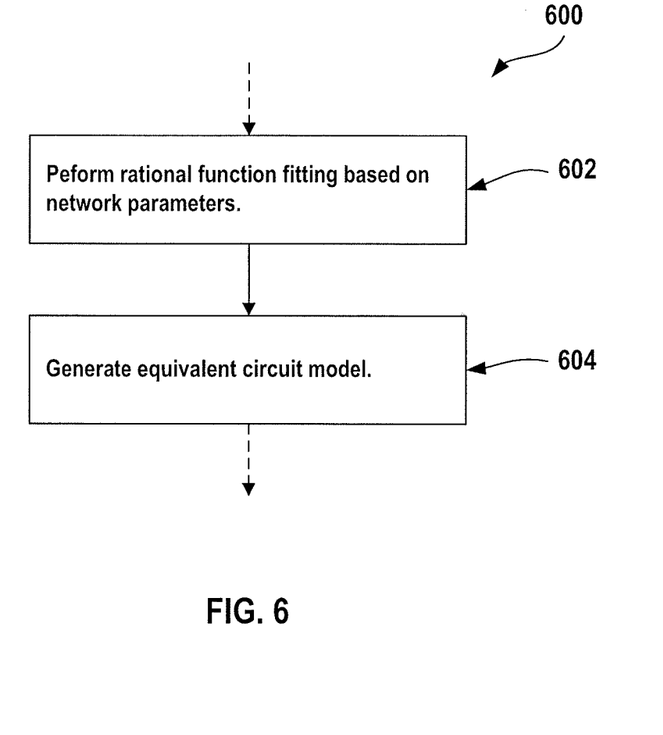
FIG. 6 is a flow chart of an exemplary method of modeling electrical circuit using new network parameters resulting from impedance adaptation, in accordance with some disclosed embodiments.

FIG. 6 is a flow chart of an exemplary method of modeling electrical circuit using new network parameters resulting from impedance adaptation, in accordance with some disclosed embodiments. In FIG. 6, method 600 may include a series of steps. Step 602 includes performing rational function fitting based on network parameters. The network parameter may be the new network parameter after impedance adaptation. In Step 604, equivalent circuit model may be generated based on the rational function fitting results. The equivalent circuit model may be an approximation of the network model (e.g., network model 200, 300, or 400) characterized by network parameters. During simulation, the equivalent circuit model may be analyzed by SPICE-like circuit simulator to simulate electrical property and/or behavior of the network model. As indicated by the dashed arrows above step 602 and below step 604, method 600 may be part of another method that includes more steps. Method 600 may also be joined to method 500. For example, step 508 may be followed by step 602.

S-parameters are often used in applications involving high frequencies, such as frequencies in RF and microwave ranges, because they are relatively easier to measure than the other types of network parameters. The method and system disclosed herein can be applicable to reference impedance adaptation in the context of S-parameters, regardless of whether the S-parameters are obtained from computation or measurement.

Figure 7:
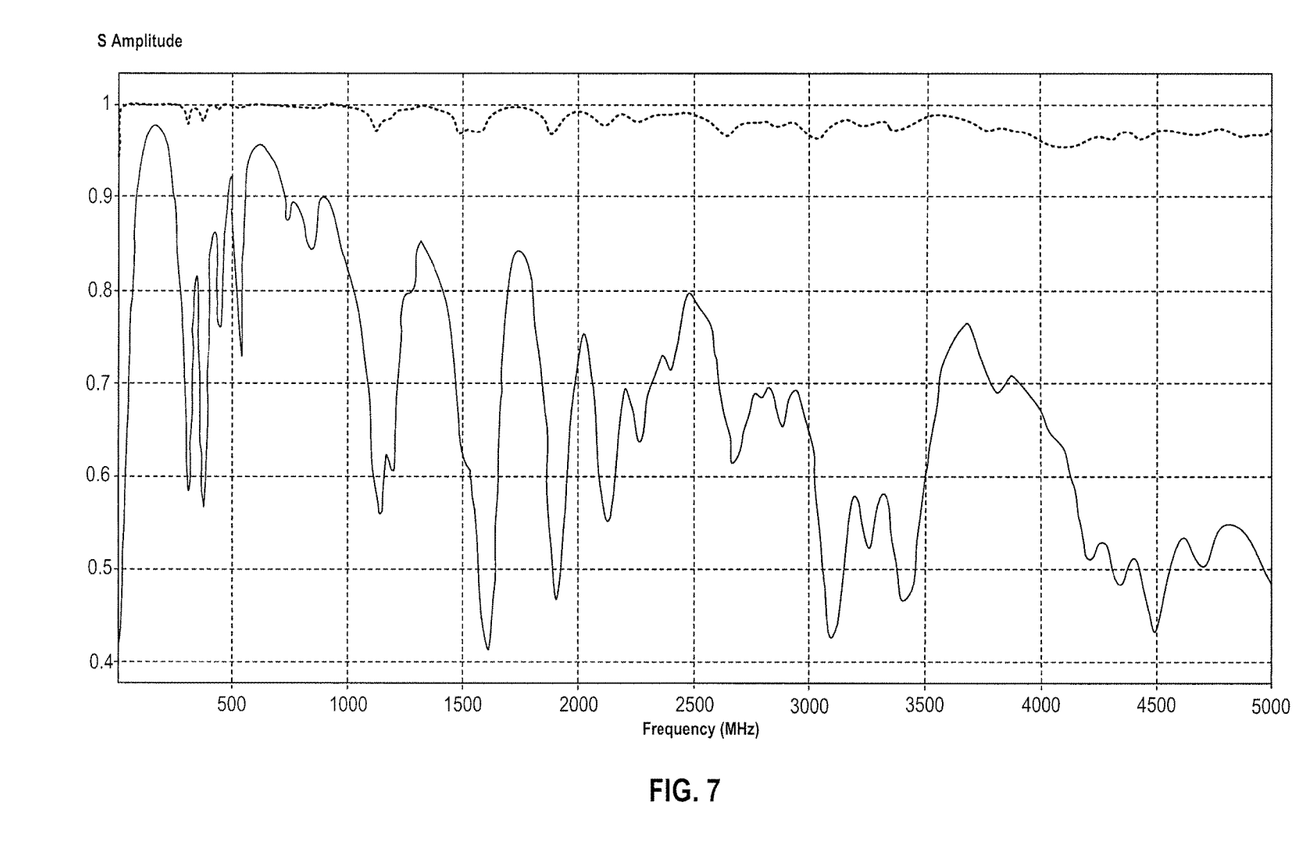
FIG. 7 shows an exemplary graph comparing S-parameter variations before and after performing reference impedance adaptation, in accordance with some disclosed embodiments.

FIG. 7 shows an exemplary graph comparing S-parameter variations before and after performing reference impedance adaptation, in accordance with some disclosed embodiments. In FIG. 7, the dashed-line curve represents the amplitude of an S-parameter in a frequency range of interest (0-5000 MHz) before reference impedance adaptation, while the solid-line curve represents the amplitude of the S-parameter after reference impedance adaptation. It can be seen that before the reference impedance adaptation, the amplitude values (normalized) concentrate toward 1, with very little variations. In contrast, the curve after reference impedance adaptation exhibits large variations. Therefore, the reference impedance adaptation may increase the sensibility of S-parameters.

A simulation project may include one or more network models. For each model, similar process may be preformed to adaptively change the reference impedance and generate new network parameters.

In the foregoing Description of Exemplary Embodiments, various features are grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Exemplary Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A method, implemented by a computer, for analyzing electrical properties of a circuit in circuit design, the method comprising:
   providing, to a computer-implemented circuit simulator, a network model of the circuit, wherein the network model includes at least one network parameter, the network parameter being associated with a port of the network model and being defined based on a reference impedance of the port;
   (i) computing, by the circuit simulator, an input impedance of the port based on the network parameter and the reference impedance;
   (ii) defining, by the circuit simulator, a new reference impedance for the port based on the input impedance;
   (iii) calculating, by the circuit simulator, a new network parameter of the network model based on the new reference impedance;
   (iv) repeating (i) to (iii), wherein for each iteration, the circuit simulator replaces a preceding reference impedance of the port with the new reference impedance, wherein the new reference impedance replaces the preceding reference impedance after the defining of the new reference impedance; and
   (v) tangibly outputting results of at least (iii) after each iteration; and
   generating an equivalent circuit model of the network model based on the new network parameter, wherein the equivalent circuit model is generated using a macro-modeling of the new network parameter.

2. The method of claim 1, the computing the input impedance comprising:
   computing an impedance value associated with the port based on the network parameter;
   computing an admittance value associated with the port based on the network parameter; and
   computing the input impedance of the port based on the impedance and admittance values.

3. The method of claim 2, wherein:
   the computing an impedance value associated with the port is based on the network parameter while all other ports of the network model are open circuits; and
   the computing an admittance value associated with the port is based on the network parameter while all other ports of the network model are short circuits.

4. The method of claim 1, wherein the defining the new reference impedance includes:
   defining the new reference impedance to be a same order as an order of the computed input impedance.

5. The method of claim 1, wherein:
   the network model includes a plurality of ports and a plurality of network parameters, each of the plurality of network parameters being associated with at least one port of the plurality and being defined based on the reference impedance;
   the step of computing input impedance includes computing a corresponding input impedance for each of the plurality of ports based on at least one of the network parameters;
   the step of defining new reference impedance includes defining a corresponding reference impedance for each of the plurality of ports based on the corresponding input impedance of the port; and
   the step of calculating includes calculating a corresponding new network parameter for each of the plurality of network parameters based on the defined reference impedance for each of the plurality of ports.

6. The method of claim 4, wherein the step of computing input impedance further includes:
   computing the corresponding input impedance for each of the plurality of ports iteratively until a difference of the corresponding input impedance between consecutive iterations is below a predetermined threshold.

7. The method of claim 1, further comprising:
   performing, by the computer, rational function fitting based on the new network parameter; and
   generating the equivalent circuit model of the network model based on the rational function fitting result.

8. The method of claim 1, wherein the circuit is a microwave or radio frequency (RF) circuit.

9. The method of claim 1, wherein the at least one network parameter is a scattering parameter and the new network parameter is more sensitive than the network parameter.

10. A non-transitory computer-readable medium encoded with software code instructions that, when executed by a computer, implement a method for analyzing electrical properties of a circuit in circuit design, the method comprising:
   providing, to a processor-implemented circuit simulator, a network model of the circuit, wherein the network model includes at least one network parameter, the network parameter being associated with a port of the network model and being defined based on a reference impedance of the port;
   (i) computing, by the circuit simulator, an input impedance of the port based on the network parameter and the reference impedance;
   (ii) defining, by the circuit simulator, a new reference impedance for the port based on the input impedance;
   (iii) calculating, by the circuit simulator, a new network parameter of the network model based on the new reference impedance;
   (iv) repeating (i) to (iii), wherein for each iteration, the circuit simulator replaces a preceding reference impedance of the port with the new reference impedance, wherein the new reference impedance replaces the preceding reference impedance after the defining of the new reference impedance; and (v) tangibly outputting results of at least (iii) after each iteration; and generating an equivalent circuit model of the network model based on the new network parameter, wherein the equivalent circuit model is generated using a macro-modeling of the new network parameter.

11. The non-transitory computer-readable medium of claim 10, the method comprising:
computing an impedance value associated with the port based on the network parameter;
computing an admittance value associated with the port based on the network parameter; and
computing the input impedance of the port based on the impedance and admittance values.

12. The non-transitory computer-readable medium of claim 11, wherein:
the computing an impedance value associated with the port is based on the network parameter while all other ports of the network model are open circuits; and
the computing an admittance value associated with the port is based on the network parameter while all other ports of the network model are short circuits.

13. The non-transitory computer-readable medium of claim 10, wherein the defining the new reference impedance includes:
defining the new reference impedance to be a same order as an order of the computed input impedance.

14. The non-transitory computer-readable medium of claim 10, wherein:
the network model includes a plurality of ports and a plurality of network parameters, each of the plurality of network parameters being associated with at least one port of the plurality and being defined based on the reference impedance;
the step of computing input impedance includes computing a corresponding input impedance for each of the plurality of ports based on at least one of the network parameters;
the step of defining new reference impedance includes defining a corresponding reference impedance for each of the plurality of ports based on the corresponding input impedance of the port; and
the step of calculating includes calculating a corresponding new network parameter for each of the plurality of network parameters based on the defined reference impedance for each of the plurality of ports.

15. The non-transitory computer-readable medium of claim 14, wherein the step of computing input impedance further includes:
computing the corresponding input impedance for each of the plurality of ports iteratively until a difference of the corresponding input impedance between consecutive iterations is below a predetermined threshold.

16. The non-transitory computer-readable medium of claim 10, the method further comprising:
performing rational function fitting based on the new network parameter; and
generating the equivalent circuit model of the network model based on the rational function fitting result.

17. The non-transitory computer-readable medium of claim 10, wherein the circuit is a microwave or radio frequency (RF) circuit.

18. A system for simulating electrical properties of a circuit, comprising:
a processor; and
a memory communicatively coupled to the processor, wherein the processor is configured to perform a method for analyzing electrical properties of a circuit in circuit design, the method comprising:
(i) loading a network model of the circuit into a processor-implemented circuit simulator, wherein the network model includes at least one network parameter, the network parameter being associated with a port of the network model and being defined based on a reference impedance of the port;
(ii) computing, by the circuit simulator, an input impedance of the port based on the network parameter and the reference impedance;
(iii) defining, by the circuit simulator, a new reference impedance for the port based on the input impedance;
(iv) calculating, by the circuit simulator, a new network parameter of the network model based on the new reference impedance;
(v) repeating (ii) to (iv), wherein for each iteration, the circuit simulator replaces a preceding reference impedance of the port with the new reference impedance, wherein the new reference impedance replaces the preceding reference impedance after the defining of the new reference impedance; and
(vi) tangibly outputting results of at least (iv) after each iteration; and
generating an equivalent circuit model of the network model based on the new network parameter, wherein the equivalent circuit model is generated using a macro-modeling of the new network parameter.

19. The system of claim 18, the processor is configured to:
compute an impedance value associated with the port based on the network parameter;
compute an admittance value associated with the port based on the network parameter; and
compute the input impedance of the port based on the impedance and admittance values.

20. The system of claim 19, wherein:
the computing an impedance value associated with the port is based on the network parameter while all other ports of the network model are open circuits; and
the computing an admittance value associated with the port is based on the network parameter while all other ports of the network model are short circuits.

21. The system of claim 18, wherein the circuit is a microwave or radio frequency (RF) circuit.

* * * * *